US008289105B2

(12) United States Patent
Chereson et al.

(10) Patent No.: US 8,289,105 B2
(45) Date of Patent: Oct. 16, 2012

(54) ELECTROMAGNETIC FILTER WITH A CONDUCTIVE CLIP RETENTION SYSTEM AND METHOD OF ASSEMBLY

(75) Inventors: Jeffrey D. Chereson, Erie, PA (US); Rob Ehrensberger, Erie, PA (US)

(73) Assignee: Spectrum Control, Inc., Fairview, PA (US)

( * ) Notice: Subject to any disclaimer, the term of this patent is extended or adjusted under 35 U.S.C. 154(b) by 415 days.

(21) Appl. No.: 12/202,215

(22) Filed: Aug. 29, 2008

(65) Prior Publication Data

US 2009/0140826 A1 Jun. 4, 2009

Related U.S. Application Data

(63) Continuation-in-part of application No. 12/116,776, filed on May 7, 2008, now abandoned.

(60) Provisional application No. 60/968,791, filed on Aug. 29, 2007, provisional application No. 60/928,036, filed on May 7, 2007.

(51) Int. Cl.
*H03H 7/01* (2006.01)
(52) U.S. Cl. .................. 333/182; 333/183; 439/620.09
(58) Field of Classification Search .................. 333/182, 333/183, 184; 439/620.07, 620.09, 620.21
See application file for complete search history.

(56) References Cited

U.S. PATENT DOCUMENTS

| | | | | |
|---|---|---|---|---|
| 3,539,954 | A | * | 11/1970 | Camire .......................... 333/183 |
| 4,187,481 | A | * | 2/1980 | Boutros ......................... 333/182 |
| 4,407,552 | A | * | 10/1983 | Watanabe et al. ........ 439/607.12 |
| 4,460,463 | A | | 7/1984 | Yoshida |
| 4,700,156 | A | | 10/1987 | Blamire et al. |
| 5,032,809 | A | * | 7/1991 | Chambers et al. ............ 333/183 |
| 5,102,354 | A | | 4/1992 | Crane et al. |
| 5,158,482 | A | | 10/1992 | Tan et al. |
| 5,246,389 | A | | 9/1993 | Briones |
| 5,635,775 | A | * | 6/1997 | Colburn et al. .................. 307/91 |
| 5,825,608 | A | | 10/1998 | Duva et al. |
| 6,459,935 | B1 | | 10/2002 | Piersma |
| 6,624,503 | B1 | | 9/2003 | Madsen et al. |
| 6,822,845 | B2 | | 11/2004 | Chereson |
| 2004/0085158 | A1 | * | 5/2004 | Van Hoyweghen et al. .. 333/182 |
| 2005/0195048 | A1 | | 9/2005 | Van Hoyweghen, III et al. |
| 2005/0248907 | A1 | | 11/2005 | Stevenson et al. |

FOREIGN PATENT DOCUMENTS

| | | |
|---|---|---|
| EP | 0978854 A2 | 2/2000 |
| JP | 07-006932 A | 1/1995 |
| WO | 2008/137941 A1 | 11/2008 |

OTHER PUBLICATIONS

International Search Report and Written Opinion for PCT/US2008/074939, Dec. 23, 2008, Spectrum Control, Inc. et al.
International Search Report and Written Opinion for PCT/US2008/062926, Oct. 27, 2008, Spectrum Control, Inc. et al.

* cited by examiner

*Primary Examiner* — Benny Lee
(74) *Attorney, Agent, or Firm* — Hodgson Russ LLP

(57) ABSTRACT

An electromagnetic filter, which may include a feed-through conductor. The feed-through conductor may have an integral extension for contacting an electrically conductive clip. The clip may have an extension-engaging portion to contact the extension and a dielectric component-contacting end to contact a dielectric component. The dielectric component may be, for example, a varistor, a chip capacitor, or the like, capable of affecting a signal carried by the feed-through conductor. The dielectric component may be proximate to the feed-through conductor and may be oriented such that a primary dimension of the dielectric component is substantially parallel to the feed-through conductor. Another embodiment may include a bus. The invention may also be embodied as methods for assembling electromagnetic filters.

38 Claims, 15 Drawing Sheets

ELECTROMAGNETIC FILTER WITH A CONDUCTIVE CLIP RETENTION SYSTEM AND METHOD OF ASSEMBLY

CROSS-REFERENCE TO RELATED APPLICATION

This application claims the benefit of priority to U.S. provisional patent application Ser. No. 60/968,791, filed on Aug. 29, 2007. Further, this patent application is a continuation-in-part of U.S. patent application Ser. No. 12/116,776, filed May 7, 2008, now abandoned. U.S. patent application Ser. No. 12/116,776 claims priority to U.S. provisional patent application Ser. No. 60/928,036, filed on May 7, 2007.

FIELD OF THE INVENTION

The present invention relates to the use of dielectrics to provide signal conditioning.

BACKGROUND OF THE INVENTION

In the prior art, it is known to use coaxial dielectric components to condition a signal being carried by a feed-through conductor. Such coaxial arrangements are expensive to manufacture, and do not readily allow for variations in the dielectric response to match differing needs. For example, if one customer desires a different response from the dielectric, it is often expensive to make the change, and may take an undesired amount of time.

To solve this problem, the prior art includes the use of two or more dielectrics, each dielectric being mounted to a substrate near the feed-through conductor. The inventor's previous patent application (U.S. patent application Ser. No. 12/116,776) provides for the use of one or more dielectric components in arrangements which increase the performance of this type of filter. However, improvements are still possible in the flexibility of design and ease of assembly of electromagnetic filters.

SUMMARY OF THE INVENTION

In the present invention, one or more electrically conductive clips may be used to electrically connect dielectric components to a feed-through conductor. Additionally, a bus may be used to connect a plurality of clips to a feed-through conductor allowing many different configurations of dielectric components to be used for signal conditioning. Using the clips and buses enables greater flexibility in design and easier assembly of electromagnetic filters.

An embodiment of the invention may be made in the form of an electromagnetic filter. The filter may include a feed-through conductor, which may have an integral extension for contacting an electrically conductive clip. The clip may have an extension-engaging portion to contact the extension and a dielectric component-contacting end to contact a dielectric component. The dielectric component may be, for example, a varistor, a chip capacitor, or the like, capable of affecting a signal carried by the feed-through conductor. The dielectric component may be proximate to the feed-through conductor and may be oriented such that a primary dimension of the dielectric component is substantially parallel to the feed-through conductor.

More than one dielectric component may be used in the filter. The clip may have a second dielectric component-contacting end and may be electrically connected to an additional dielectric component. In another embodiment, the dielectric components may have more than one dielectric device connected in series.

The space around the periphery of the feed-through conductor that is not occupied by the dielectric components or clips may be occupied by insulating material. And the filter may have a housing, which may surround the dielectric component(s) and the insulators, if any.

Another embodiment of a filter according to the invention may have a filter mounted on a substrate. The substrate may be, for example, a printed circuit board. The substrate may have an orifice through which the feed-through conductor may extend.

Another embodiment of the present invention may comprise a filter which includes a bus. An electrically conductive clip may have a bus-engaging portion in contact with the bus and a dielectric component-contacting end electrically connected to a dielectric component. The bus may have integral tabs for contacting a feed-through conductor.

The invention may also be embodied as a method for assembling an electromagnetic filter, in which a dielectric component and an electrically conductive clip may be provided. The clip may be placed in contact with the dielectric component (or the dielectric component in contact with the clip). A feed-through conductor with an extension may be provided and placed so that the extension may contact the clip. A force may be exerted so as to cause the extension to move into an extension-engaging portion of the clip. Such a force may be caused, for example, by pushing or pulling the feed-through conductor, the clip, or the extension. For example, the extension may be pressed into the clip. Steps may be added to the method to add a housing and/or insulating material.

The invention may also be embodied as a method for assembling an electromagnetic filter, in which a dielectric component, an electrically conductive clip, and a bus may be provided. The clip may be placed in contact with the dielectric component (or the dielectric component in contact with the clip). The bus may be placed so that the extension may contact the clip. A force may be exerted so as to cause the bus to move into an bus-engaging portion of the clip. Such a force may be caused, for example, by pushing or pulling the bus, the clip, or both. For example, the bus may be pressed into the clip. A feed-through conductor may be provided and placed in contact with the bus. Steps may be added to the method to add a housing and/or insulating material.

BRIEF DESCRIPTION OF THE DRAWINGS

For a fuller understanding of the nature and objects of the invention, reference should be made to the following detailed description taken in conjunction with the accompanying drawings, where like features throughout the drawing figures are denoted by the same reference number, and in which.

DETAILED DESCRIPTION OF THE INVENTION

Figure 1:
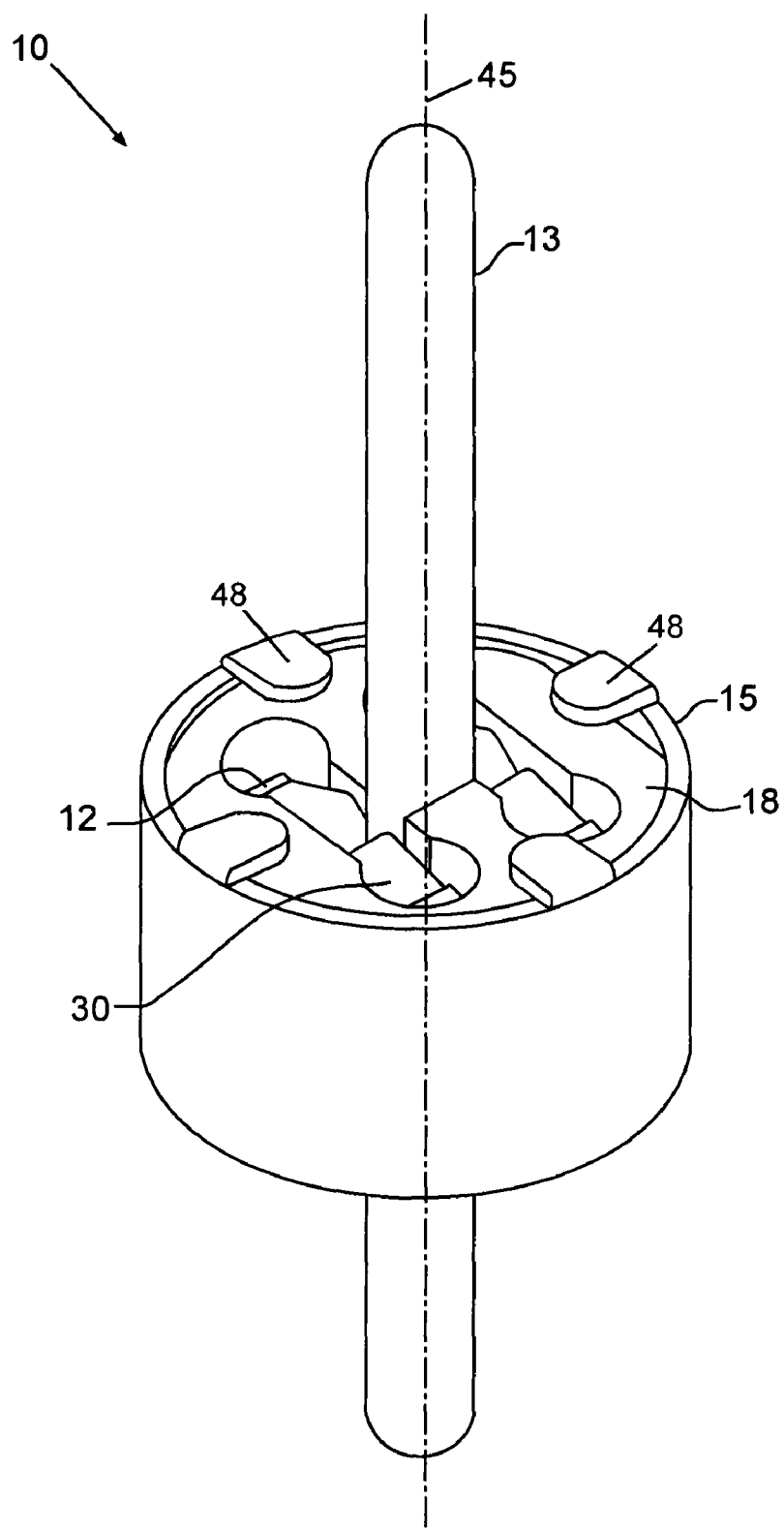
FIG. 1 is a perspective view of a device according to the invention.
Figure 2:
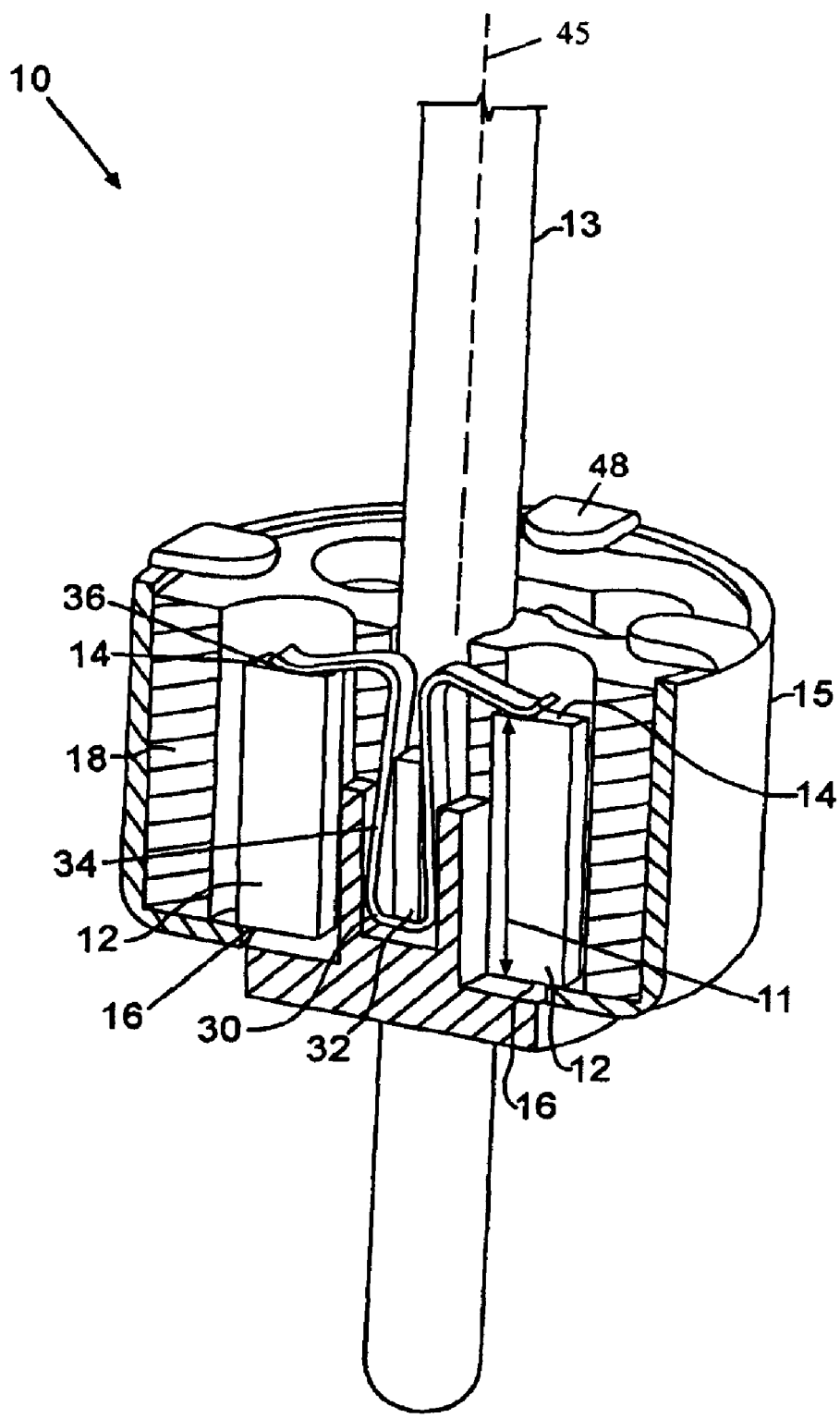
FIG. 2 is a perspective view of the device of FIG. 1, in which part of the device has been cut away to show a portion of the interior of the device.
Figure 6:
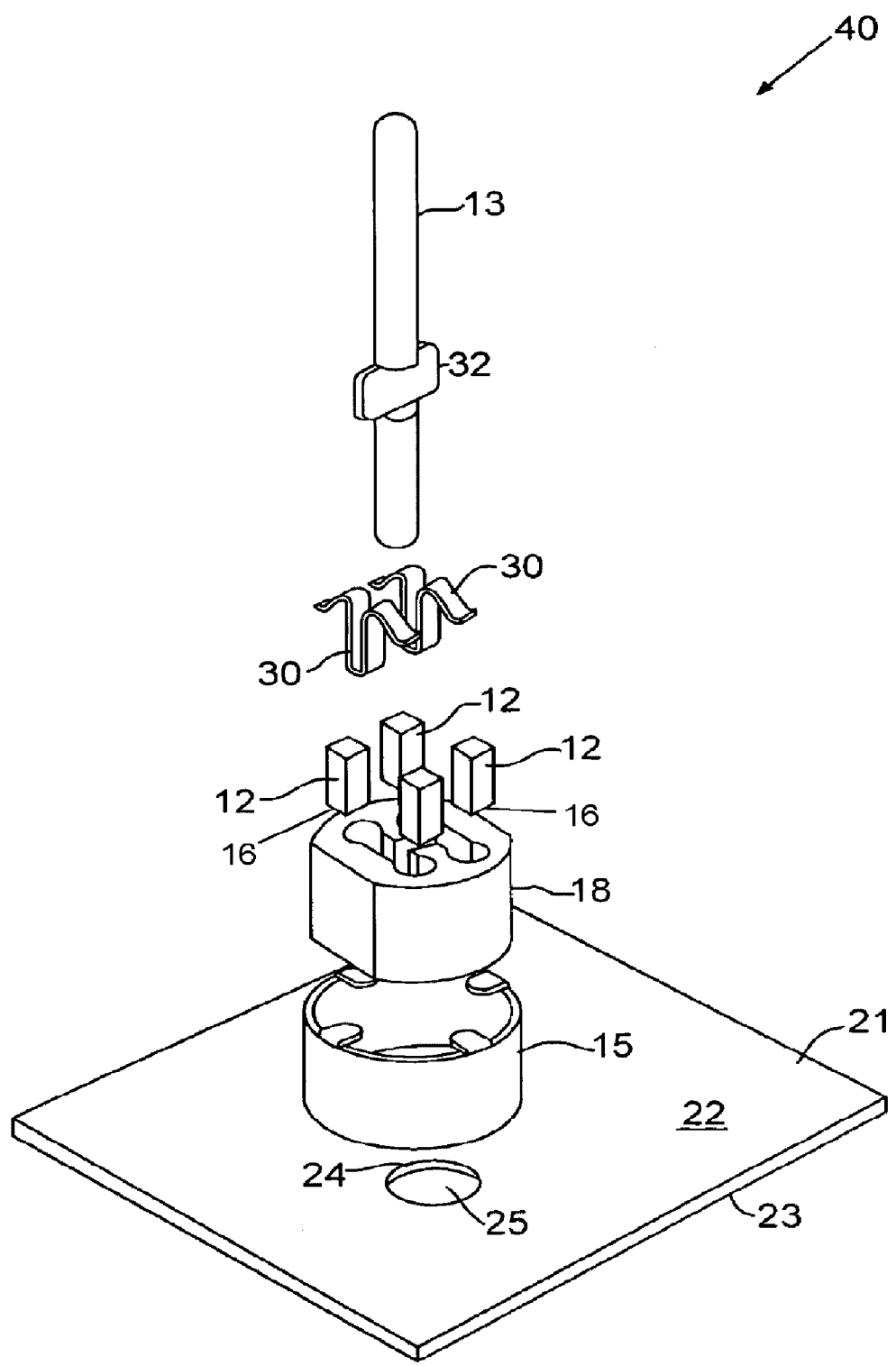
FIG. 6 is an exploded view of a device according to another embodiment of the invention.
Figure 7:
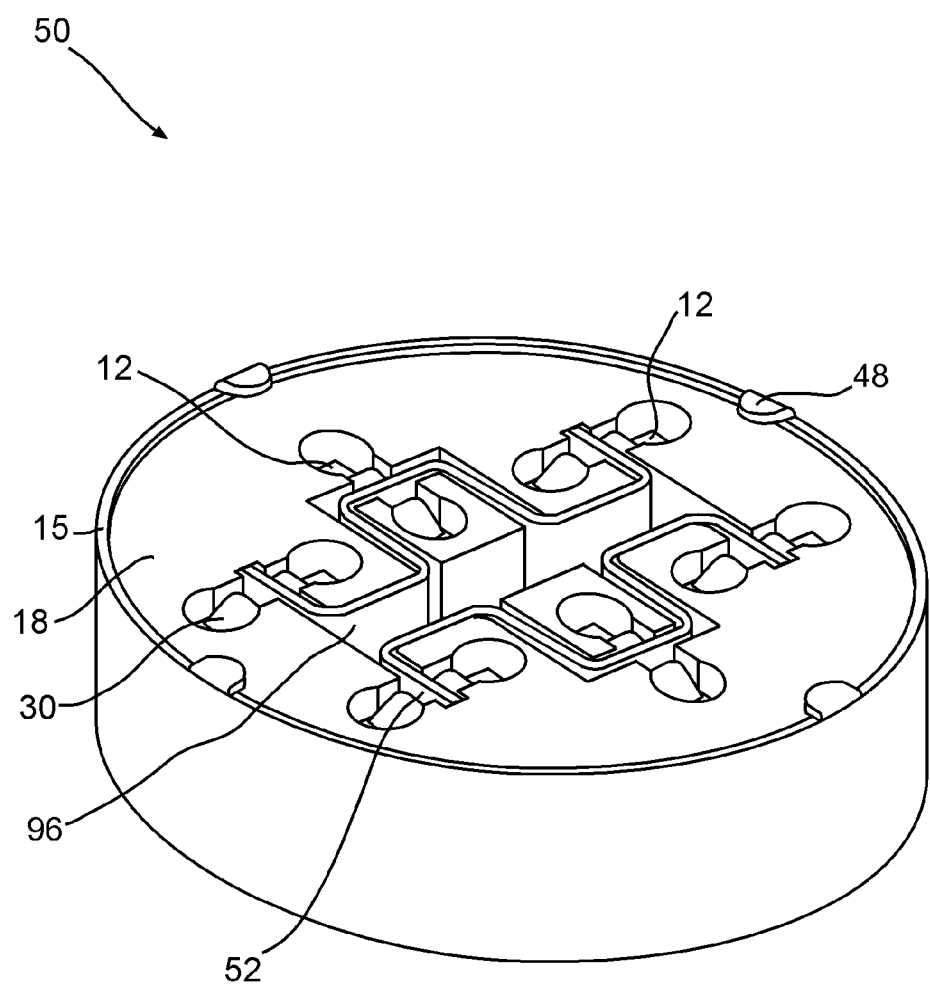
FIG. 7 is a perspective view of a device according to another embodiment of the invention.
Figure 8:
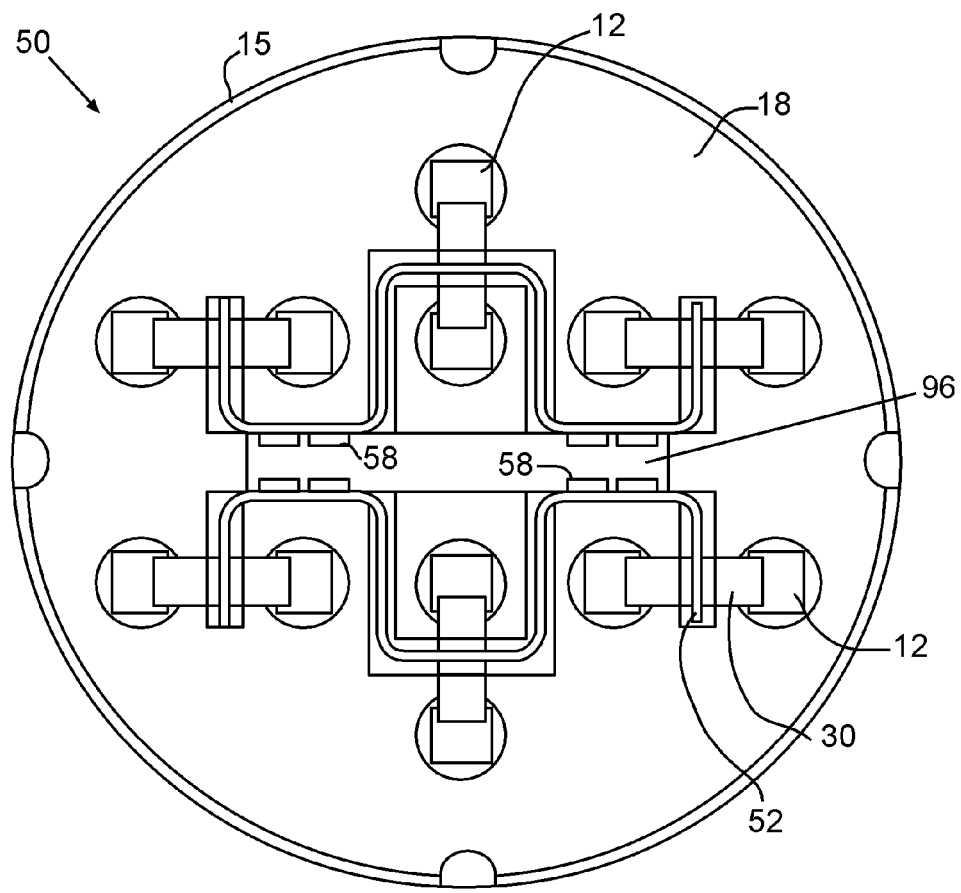
FIG. 8 is a top view of the device of FIG. 7.

An embodiment of the invention may be made in the form of an electromagnetic filter 10. FIG. 1 is a perspective view of such a filter 10. FIG. 2 is another perspective view of the filter 10 that has been partially sectioned to show certain features. The filter 10 may include a feed-through conductor 13. The feed-through conductor 13 may have an extension 32 (e.g. FIG. 2) extending away from a longitudinal dimension 45 (e.g. FIG. 1) of the feed-through conductor 13. The extension 32 may be integrated with the feed-through conductor 13 by forming the extension 32 and feed-through conductor 13 together, for example, by casting the extension 32 and feed-through conductor 13 as one piece. The extension 32 may be integrated with the feed-through conductor 13 by, for example, forging the feed-through conductor 13 to cause displaced material from the feed-through conductor to be the extension 32 (FIG. 6). The extension 32 and feed-through conductor 13 may also be integrated from two separate components by, for example, welding or brazing the extension 32 onto the feed-through conductor 13, or by fitting a cold dowel into a hole of the hot feed-through conductor 13 and allowing thermal expansion/contraction to fix the dowel with the feed-through conductor 13. These methods of integrating the extension 32 and feed-through conductor 13 are meant to be illustrative, and other methods for integration will be readily apparent to those skilled in the art.

Figure 4A:
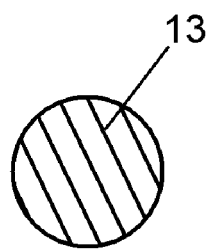
FIG. 4A is a cross section view showing the cross section of a feed-through conductor according to the invention.
Figure 4B:
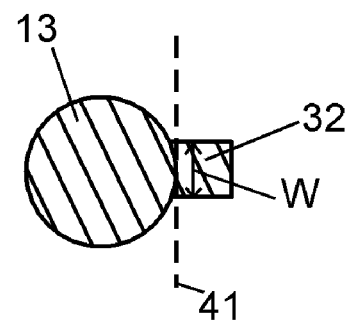
FIG. 4B is a cross section view showing the cross section of a feed-through conductor with an extension according to the invention.

FIG. 4A shows a cross section of one type of feed-through conductor 13, and FIG. 4B shows a cross section of the feed-through conductor 13 of FIG. 4A taken at a longitudinal position at which an extension 32 is located. FIG. 4B demonstrates that the cross section of the feed-through conductor 13 may differ from the cross section of the extension 32. The cross sections depicted in FIGS. 4A and 4B are taken along planes which are perpendicular to the longitudinal dimension 45 of the feed-through conductor 13.

FIG. 2 shows that an electrically conductive clip 30 may have an extension-engaging portion 34 and a dielectric component-contacting end 36. The extension-engaging portion 34 may be in contact with the extension 32. A dielectric component 12, having a first electrical contact 14 and a second electrical contact 16, may be provided. The dielectric component 12 may be, for example, a varistor, a chip capacitor, or the like, capable of affecting a signal carried by the feed-through conductor 13. The first electrical contact 14 of the dielectric component 12 may be electrically connected dielectric component-contacting end 36 of the clip 30. The electrical connection at the first electrical contact 14 of the dielectric component 12 may be made, for example, by simple contact between the dielectric component-contacting end 36 and the first electrical contact 14, by soldering, by use of a conductive epoxy, by use of a spring compressed between the dielectric component 12 and the clip 30, and/or by forcing the dielectric component 12 against the clip 30 by a spring applying pressure to the second electrical contact 16 of the dielectric component 12.

Figure 3:
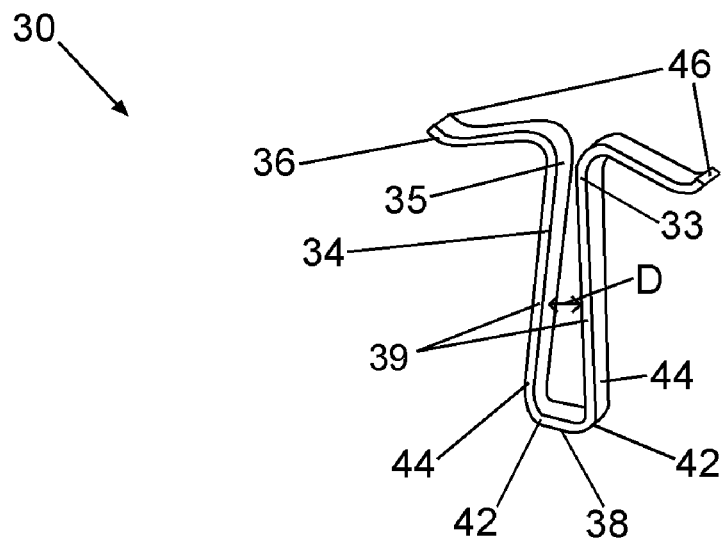
FIG. 3 is a perspective view of an electrically conductive clip according to the invention.

FIG. 3 shows that the clip 30 may have a base 38 having two ends 42. Two arms 39, each having a base end 44 and a far end 46 may be connected to the base 38. Each arm's base end 44 may be connected to a different end 42 of the base 38. The base 38 and arms 39 of the clip 30 may form the extension-engaging portion 34 of the clip 30. The clip 30 may be created from multiple, connected components or from a single piece of material, such as, for example, by bending a ribbon of an electrically conductive material. The extension 32 may reside between the arms 39, and the clip 30 may contact the extension 32 in at least two locations 33, 35. The extension 32 may have a width W (FIG. 4B), the width W being measured along a tangent 41 of the feed-through conductor 13. A distance D between the arms 39 may be less than the width W so that a force is required to insert the extension 32 into the clip 30, and remove the extension 32 from the clip 30. In this way, contact between the extension 32 and the clip 30 may be improved when the extension 32 resides in the extension-engaging portion 34.

The far end 46 of at least one arm 39 may be the dielectric component-contacting end 36 of the clip 30. The dielectric component-contacting end 36 may be configured so as to provide a spring force on the first electrical contact 14, for example by curving the dielectric component-contacting end 36 towards the dielectric component 12. In this configuration, the force used to insert the feed-through conductor 13 into the clip 30 may also create a force on the dielectric component 12 to cause the dielectric component-contacting end 36 to contact the first electrical contact 14.

The dielectric component 12 may have dimensions, such as a length dimension, a width dimension and a depth dimension. Herein, reference is made to a "primary dimension", which is a dimension of the dielectric component 12 for which there is no other dimension that is longer than the primary dimension. In some embodiments of the invention, there will be one dimension of the dielectric component 12 that is the longest dimension, and that will be the primary dimension. In other embodiments of the invention, there will be two or more dimensions that are of equal length and for which there is no other dimension that is longer, and in that situation any of these equal length dimensions may be considered to be the primary dimension.

The dielectric component 12 may be proximate to the feed-through conductor 13 and may be oriented such that the primary dimension of the dielectric component 12 is substantially parallel to the feed-through conductor 13. For example, if the feed-through conductor 13 is cylindrical, the primary dimension of the dielectric component 12 may be oriented to be substantially parallel to the center line of the feed-through conductor 13. In FIG. 2, a dielectric component 12 is depicted as a rectangular parallelepiped package having three dimensions of different lengths. It can be seen that the dielectric 12 is oriented such that the primary dimension 11 of the dielectric component 12 is substantially parallel to longitudinal dimension 45 of the feed-through conductor 13.

More than one dielectric component 12 may be used in the filter 10. The clip may have a second dielectric component-contacting end 36 and may be electrically connected to the first electrical contact 14 of the additional dielectric component 12. The dielectric components 12 may be similarly positioned with respect to the feed-through conductor 13 in that they may be proximate to the feed-through conductor 13 so that (1) the size of the clip 30 may be minimized and (2) the field effects of the dielectric component 12 may enhance signal conditioning on a signal transmitted through the feed-through conductor 13. Also, the dielectric components 12 may be oriented similarly with respect to the feed-through conductor 13 in that each dielectric component 12 may be oriented so that the primary dimension of each dielectric component 12 is substantially parallel to the longitudinal dimension 45 of the feed-through conductor 13.

The dielectric components 12 may be positioned at substantially the same lengthwise location of the feed-through conductor 13 so that the electromagnetic effect on the feed-through conductor 13 caused by the dielectric components 12 occurs at substantially the same lengthwise location. In this manner, the dielectric components 12 may provide higher radio-frequency ("RF") performance (insertion loss) than conventional chip capacitor filter designs. The arrangement of the dielectric components 12 may allow the filter 10 to approach the performance of a coaxial filter, without using a coaxial filter.

Figure 5:
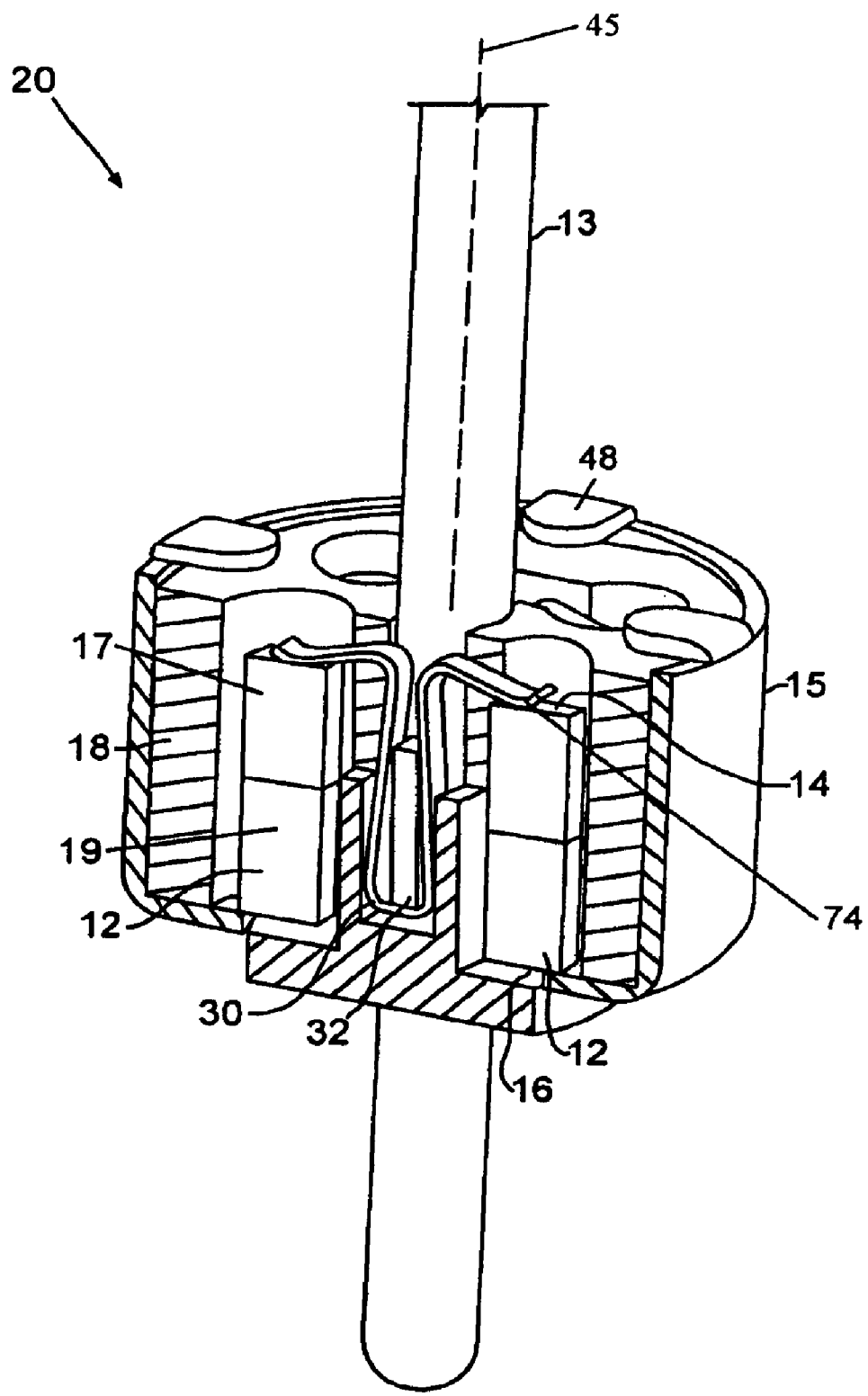
FIG. 5 is a perspective view of a device according to another embodiment of the invention, in which part of the device has been cut away to show a section of the interior of the device.

FIG. 5 depicts a filter 20 that is in keeping with the invention. In this filter 20, the dielectric components 12 each have more than one dielectric device 17, 19. In the filter 20, the dielectric devices 17, 19 are capacitors connected in series so that the second electrical contact of the first capacitor 17 is electrically connected to the first electrical contact of the second capacitor 19. The dielectric devices 17, 19 may be oriented such that a primary dimension of each dielectric device 17, 19 is substantially parallel to the longitudinal dimension 45 of the feed-through conductor 13. This arrangement of the dielectric components 12 also allows a designer to tune the circuit by selecting dielectric devices 17, 19 having different characteristics, and may allow a designer to create a failsafe by having redundant dielectric devices 17, 19, thereby providing filtering even if one of the dielectric devices 17, 19 should fail.

The space around the periphery of the feed-through conductor 13 that is not occupied by the dielectric components 12 or clips 30 may be occupied by insulating material 18. For example, FIG. 1 depicts insulating material 18 disposed in the circumferential spaces between the dielectric components 12 and clips 30.

The filter 10 in FIGS. 1 and 2 may have a housing 15, which may surround the dielectric component(s) 12 and the insulating material 18, if any. The housing 15 may be present to provide protection to the electromagnetic filter 10, for example protection from stray mechanical or electrical contact with other devices. The second electrical contacts 16 of the dielectric components 12 may be electrically connected to the housing 15. The housing 15 may be fashioned to permit the dielectric components 12 and insulators 18 to be assembled as an integral unit. The housing 15 may include tabs 48, which may later be used to attach the housing 15 to a substrate, such as a printed circuit board and/or hold the insulating material 18 in the housing. By using such a housing 15, the filter 10 may be preassembled with the housing 15, and later the filter 10 may be used as an integral unit during production of a finished product that may include a substrate.

Another embodiment of a filter 40 according to the invention is depicted in FIG. 6. Here, the filter 40 is mounted on a substrate 21 having a first side 22. The substrate 21 may be, for example, a printed circuit board. The substrate 21 may have a second side 23 and a feed-through surface 24. The feed-through surface 24 may define an orifice 25 extending from the first side 22 to the second side 23. The feed-through conductor 13 may extend through the orifice 25. The second electrical contact 16 of the dielectric component 12 may be electrically connected to the substrate 21 via the housing 15, or to an electric circuit on the substrate 21.

Figure 9:
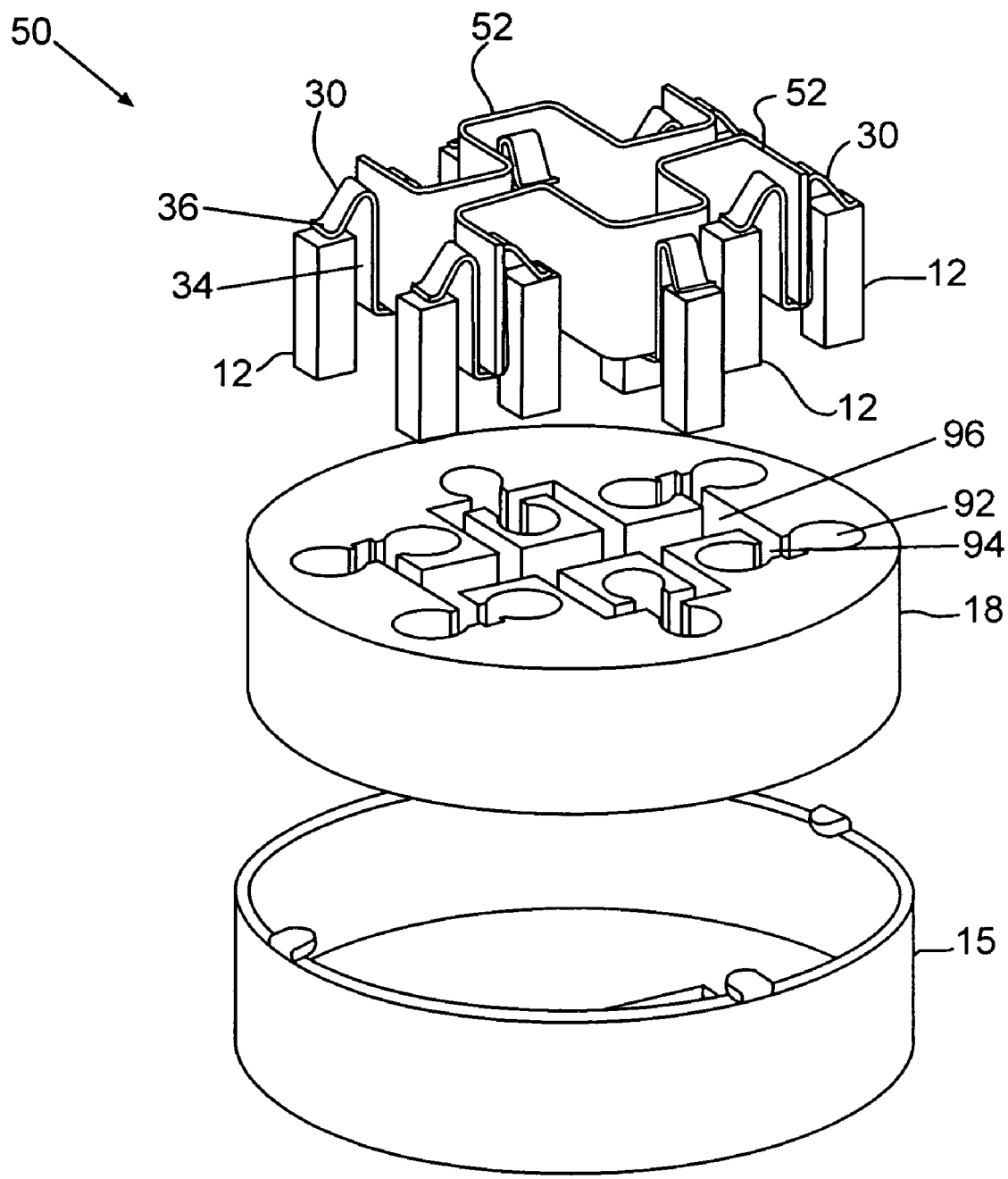
FIG. 9 is an exploded view of the device of FIGS. 7 and 8.

FIGS. 7-10 depict another embodiment of a filter 50 according to the invention. This embodiment of the invention may include a bus 52. An electrically conductive clip 30 may contact the bus 52 in lieu of an extension of the feed-through conductor, and the portion previously referred to as the "extension-engaging portion" may be considered a bus-engaging portion 34 (FIG. 9). The clip may have a dielectric component-contacting end 36 (FIG. 9). The bus-engaging portion 34 may be in contact with the bus 52. A dielectric component 12, similar to those previously described, may be provided. A first electrical contact 14 (FIG. 10) of the dielectric component 12 may be electrically connected to the dielectric component-contacting end 36 of the clip 30.

Figure 10:
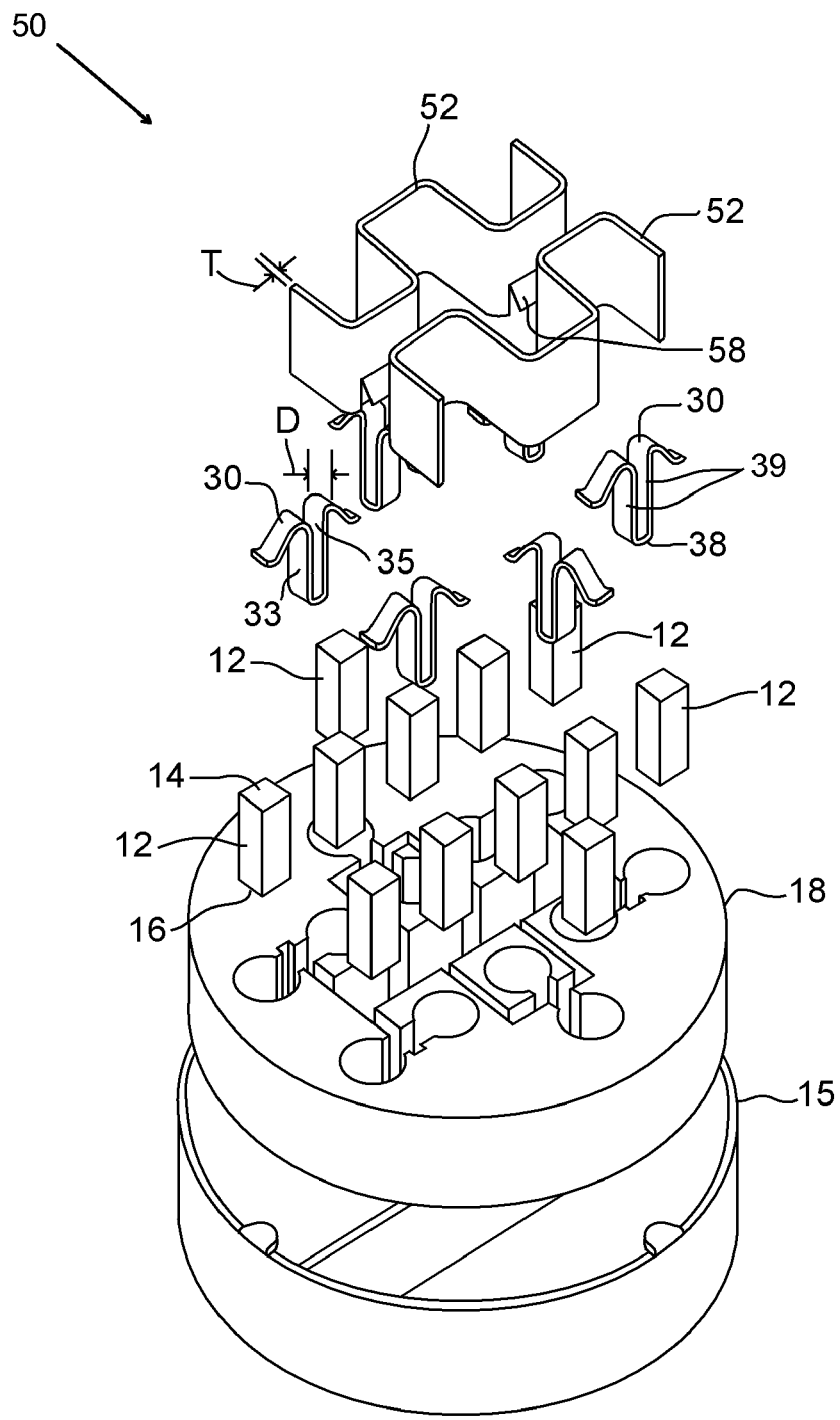
FIG. 10 is a more fully exploded view of the device of FIGS. 7-9.

FIG. 10 shows that the clip 30 may have a base 38 and two arms 39, which may form the bus-engaging portion 34 of the clip 30. The bus 52 may reside between the arms 39 and the clip 30 may contact the bus 52 in at least two locations 33, 35. The bus 52 may have a thickness T. A distance D between the arms 39 may be less than the thickness T so that a force is required to insert the bus 52 into the clip 30, and remove the bus 52 from the clip 30. In this way, contact between the bus 52 and the clip 30 may be improved when the bus 52 resides in the bus-engaging portion 34.

The filter 50 may have a housing 15, which may surround the dielectric component(s) 12 and the insulators 18, if any. The second ends 16 of the dielectric components 12 may be electrically connected to the housing 15.

Figure 11:
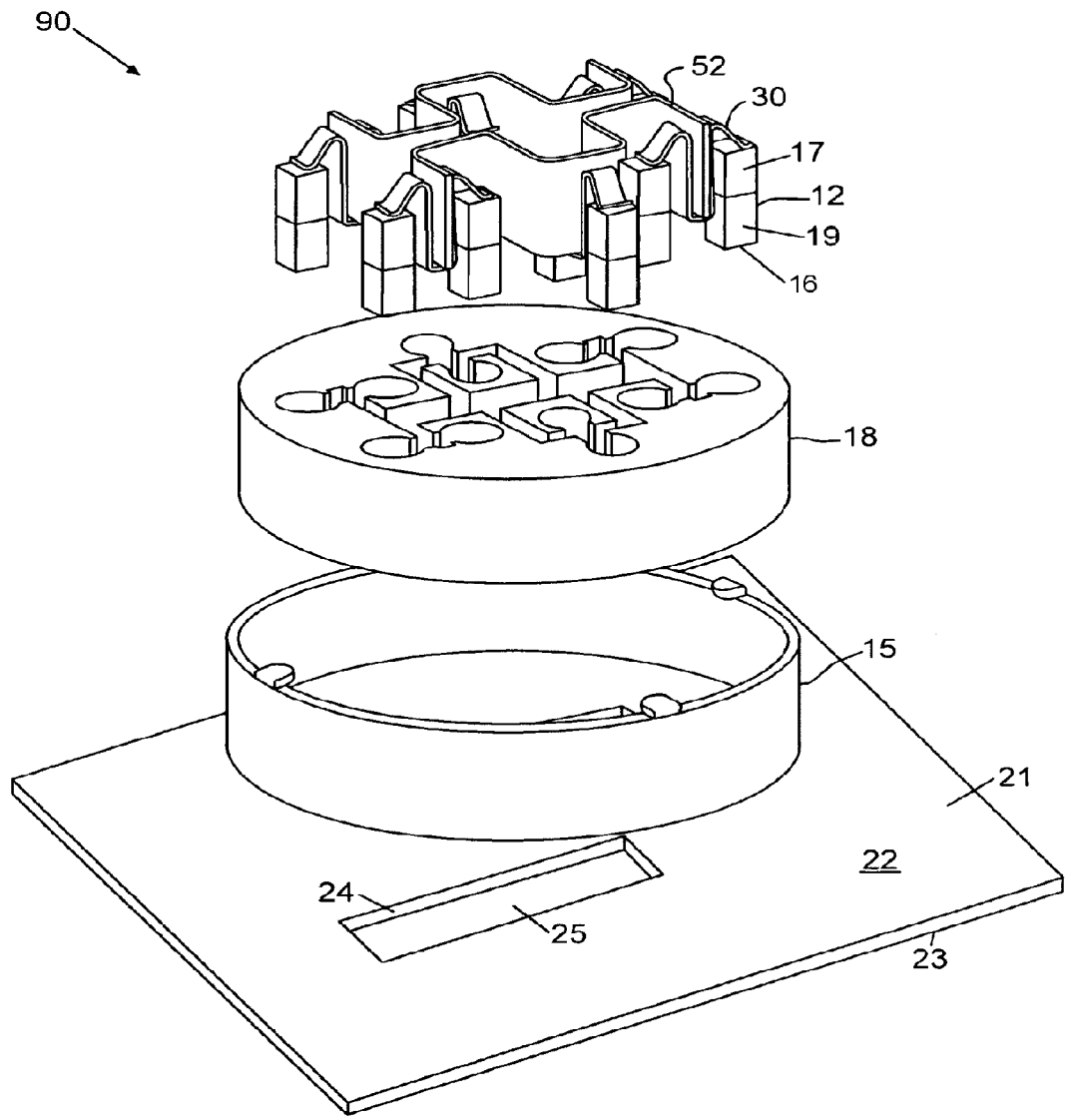
FIG. 11 is an exploded view of a device according to another embodiment of the invention.

FIG. 11 depicts a filter 90 that is in keeping with the invention, wherein the dielectric components 12 each have more than one dielectric device 17, 19. In the filter 90, the dielectric devices 17, 19 are capacitors connected in series so that the second electrical contact of the first capacitor 17 is electrically connected to the first electrical contact of the second capacitor 19.

FIG. 11 shows an embodiment of the invention in which the filter 90 may be mounted on a substrate 21 having a first side 22. The substrate 21 may have a second side 23 and a feed-through surface 24. The feed-through surface 24 may define an orifice 25 extending from the first side 22 to the second side 23. A feed-through conductor 13 (not shown in FIG. 11) may extend through the orifice 25. The second end 16 of the dielectric component 12 may be electrically connected to the substrate 21, or to an electric circuit on the substrate 21.

Figure 12:
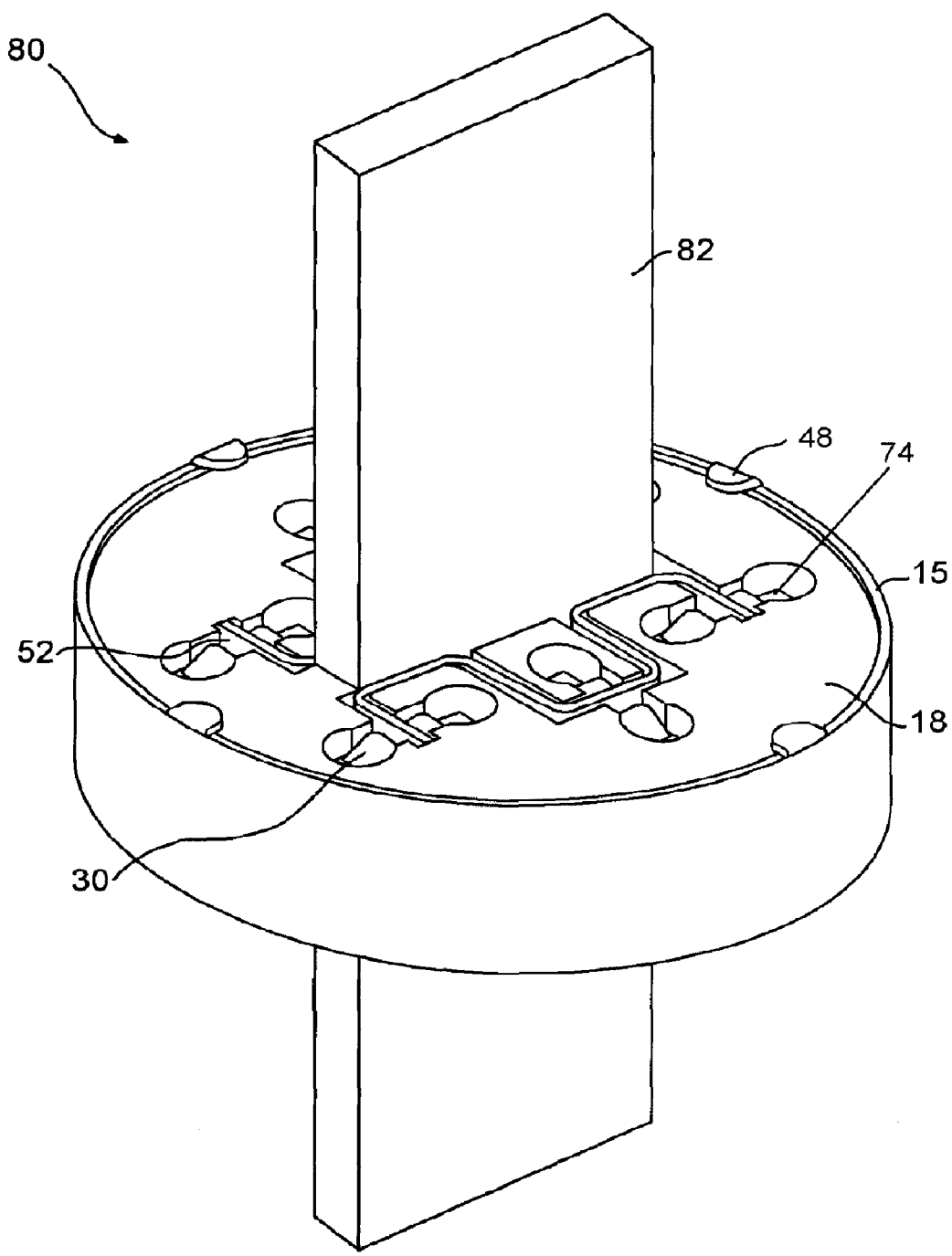
FIG. 12 is a perspective view of a device according to another embodiment of the invention.

FIG. 12 shows the filter 80 with a feed-through conductor 82, which may contact the bus 52. The bus 52 may include tabs 58 (FIGS. 8 and 10) integrated with the bus 52 in order to contact the feed-through conductor 82. In FIG. 12, the feed-through conductor 82 is depicted as having a rectangular cross section, however, the feed-through conductor 82 may be of any shape and constructed as a solid conductor or any other structure, for example braided, so long as contact with the bus 52 is made. The dielectric component 12 may be proximate to the feed-through conductor 82, and may be oriented such that the primary dimension of the dielectric component is substantially parallel to the feed-through conductor 82.

Filter 80 may include more than one dielectric component 12. The clip 30 may have a second dielectric component-contacting end 74 and may be electrically connected to the first electrical contact 14 of the additional dielectric component 12 (not shown in FIG. 12). The dielectric components 12 may be similarly positioned with respect to the feed-through conductor 82 in that they may be proximate to the feed-through conductor 82. Also, the dielectric components 12 may be oriented similarly with respect to the feed-through conductor 82 in that each dielectric component 12 may be oriented so that the primary dimension of each dielectric component 12 is substantially parallel to the feed-through conductor 82.

The space around the periphery of the feed-through conductor 13 that is not occupied by the dielectric components 12, clips 54, or bus 52 may be occupied by insulating material 18. For example, the embodiment in FIG. 12 depicts insulating material 18 disposed in the circumferential spaces between the dielectric components 12.

Figure 13:
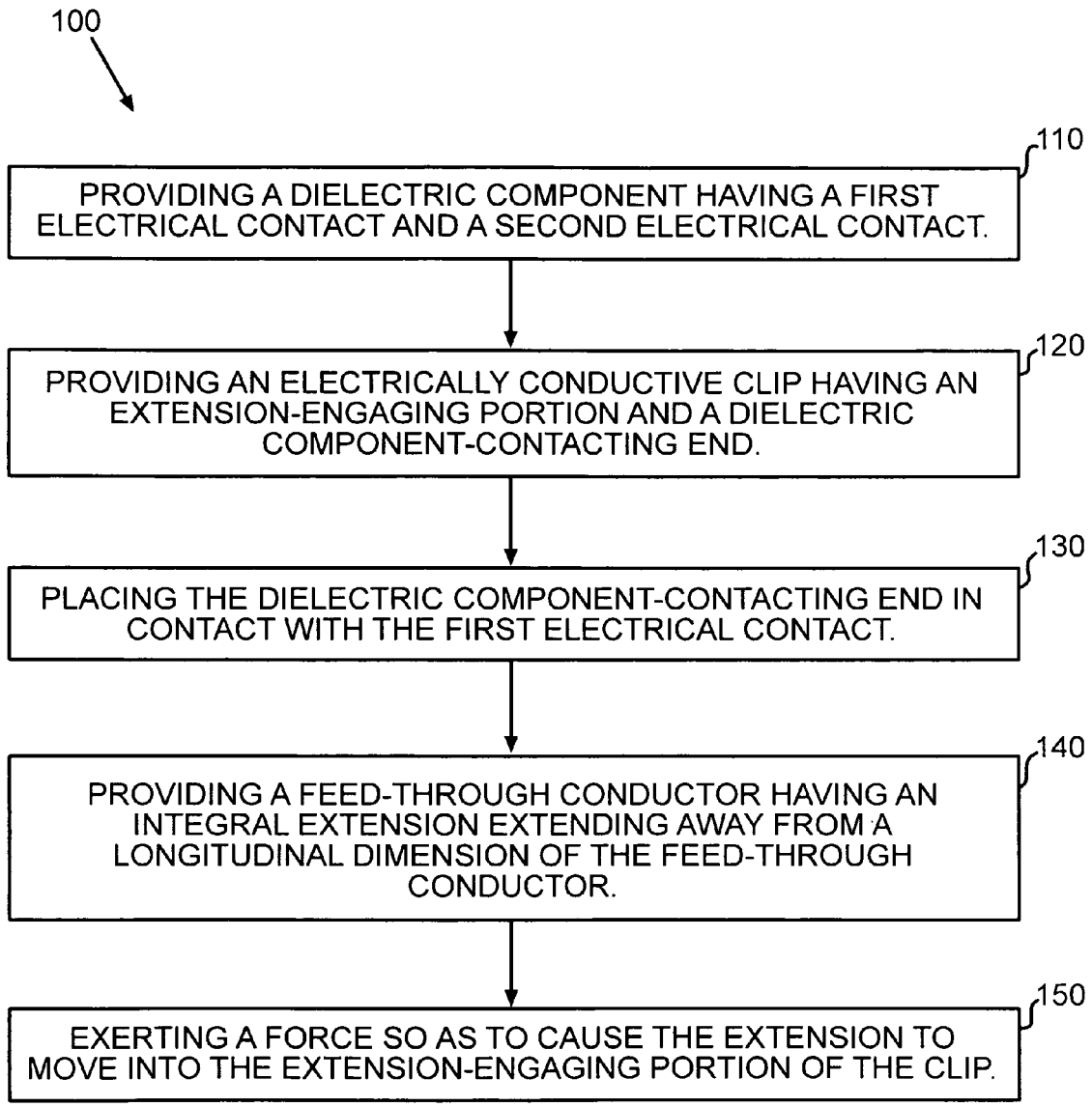
FIG. 13 is a flow chart of a method according to the invention.

Having described systems and devices according to the invention, it may be apparent that the invention may include a method of assembling an electromagnetic filter. FIG. 13 depicts one such method 100. In that method 100, a dielectric component may be provided 110. The dielectric component may have a first electrical contact and a second electrical contact, as described above. An electrically conductive clip having an extension-engaging portion and a dielectric component-contacting end may be provided 120. The dielectric component-contacting end of the clip may be placed 130 in contact with the first electrical contact of the dielectric component. A feed-through conductor may be provided 140. The feed-through conductor may have an integral extension extending away from a longitudinal dimension of the feed-through conductor. A force may be exerted 150 so as to cause the extension of the feed-though conductor to move into the extension-engaging portion of the clip. Such a force may be caused, for example, by pushing or pulling the feed-through conductor, the clip, or the extension. For example, the extension may be pressed into the clip.

Figure 14:
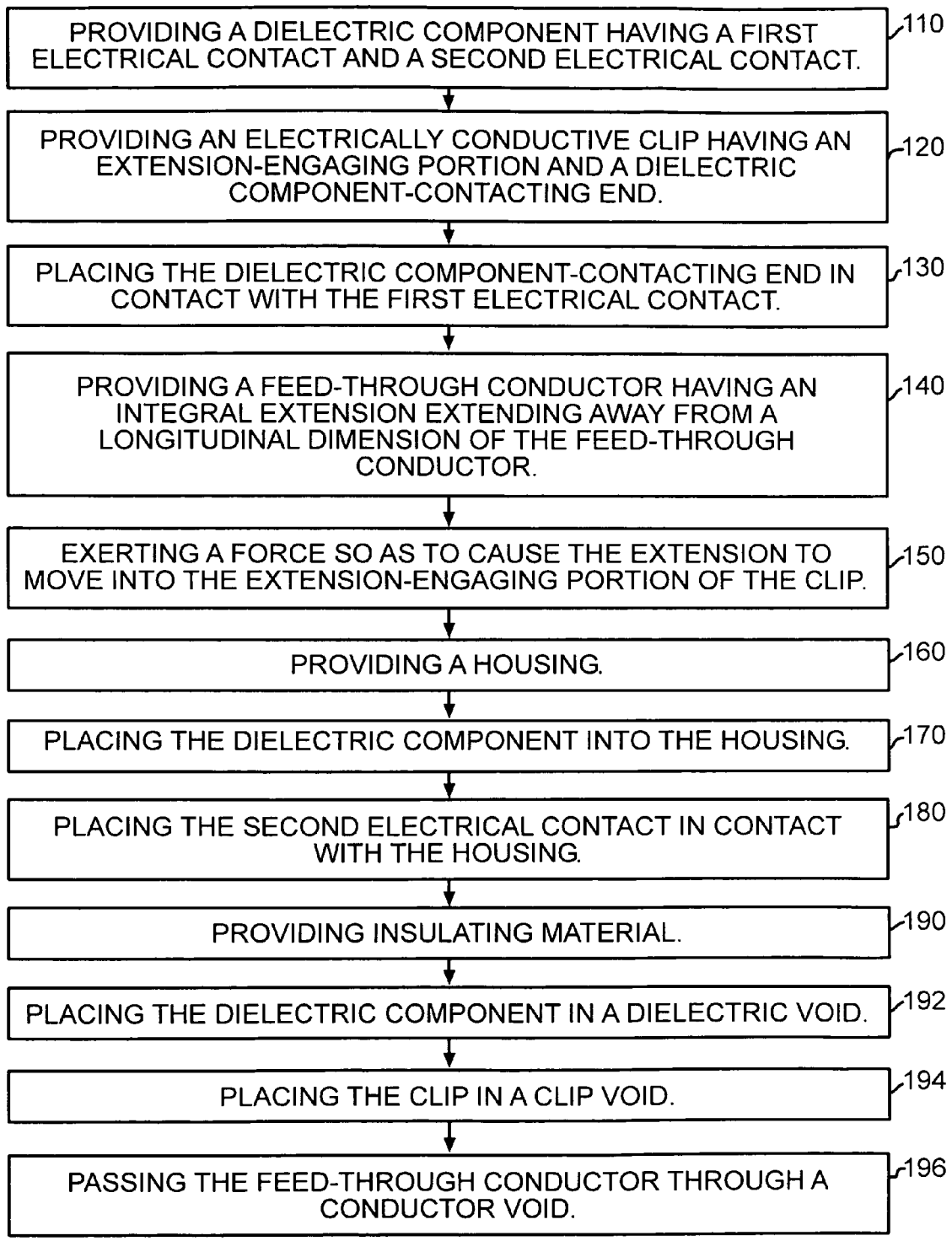
FIG. 14 is a flow chart of the method of FIG. 13 showing additional steps.

FIG. 14 shows method 100 augmented with additional steps. The method 100 of assembling may also comprise the step of providing 160 a housing and placing 170 the dielectric component within the housing. The second electrical contact of the dielectric component may be placed 180 in contact with the housing. The method 100 may include providing 190 insulating material, which may include voids into which the dielectric component, the clip, and the conductor may be placed. Examples of such voids are shown in FIG. 9 as a dielectric void 92, a clip void 94, and a conductor void 96. The dielectric component may be placed 192 in the dielectric void 92, the clip may be placed 194 in the clip void 94, and the feed-through conductor may be passed through 196 the conductor void 96. The steps of the method 100 may be performed in any convenient fashion.

Figure 15:
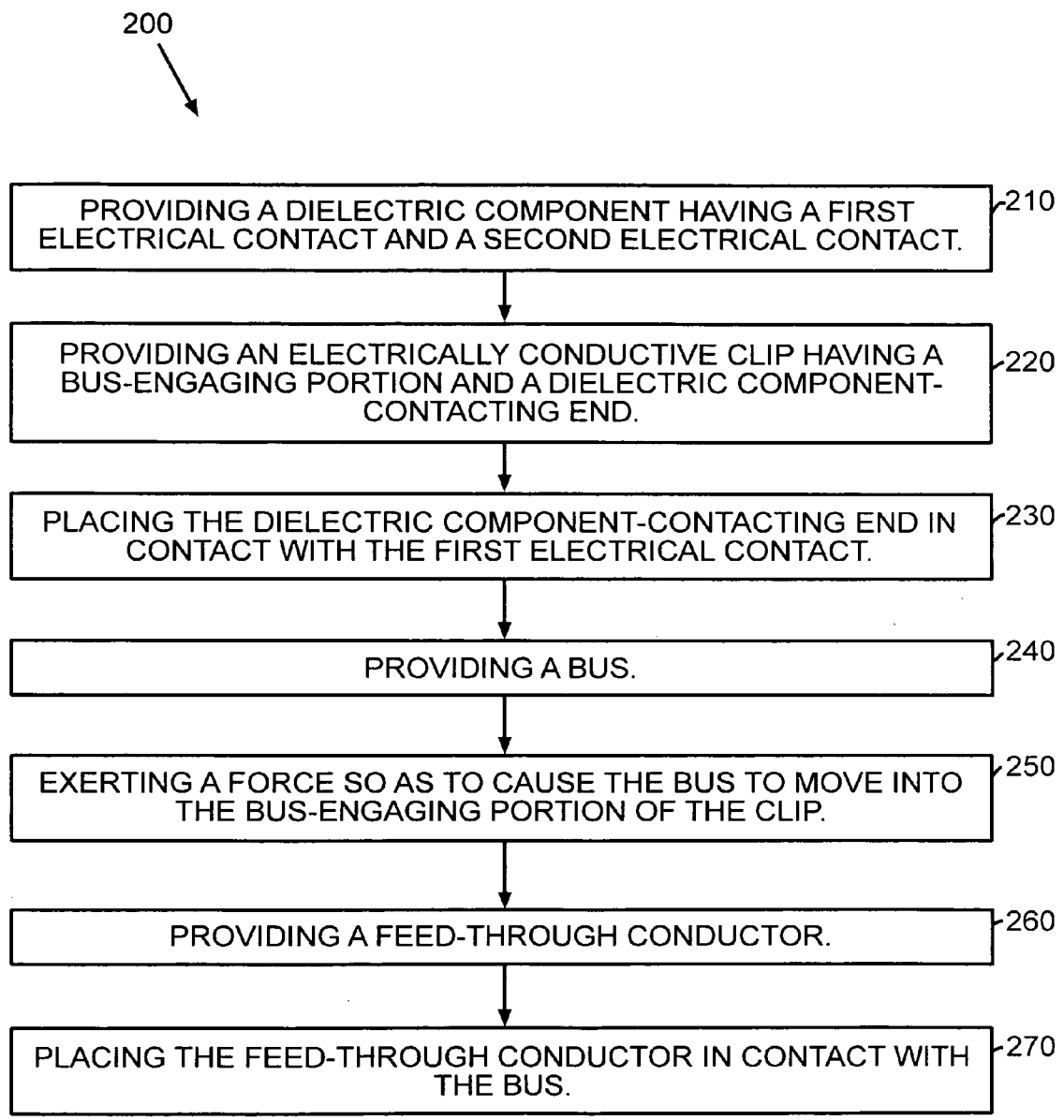
FIG. 15 is a flow chart of a method according to another embodiment of the invention.

FIG. 15 depicts another method 200 which is in keeping with the invention and may be a method of assembling an electromagnetic filter. In method 200, a dielectric component may be provided 210. The dielectric component may have a first electrical contact and a second electrical contact, as described above. An electrically conductive clip having a bus-engaging portion and a dielectric component-contacting end may be provided 220. The dielectric component-contacting end of the clip may be placed 230 in contact with the first electrical contact of the dielectric component. A bus may be provided 240. A force may be exerted 250 so as to cause the bus to move into the bus-engaging portion of the clip. A feed-through conductor may be provided 260 and placed 270 in contact with the bus.

Figure 16:
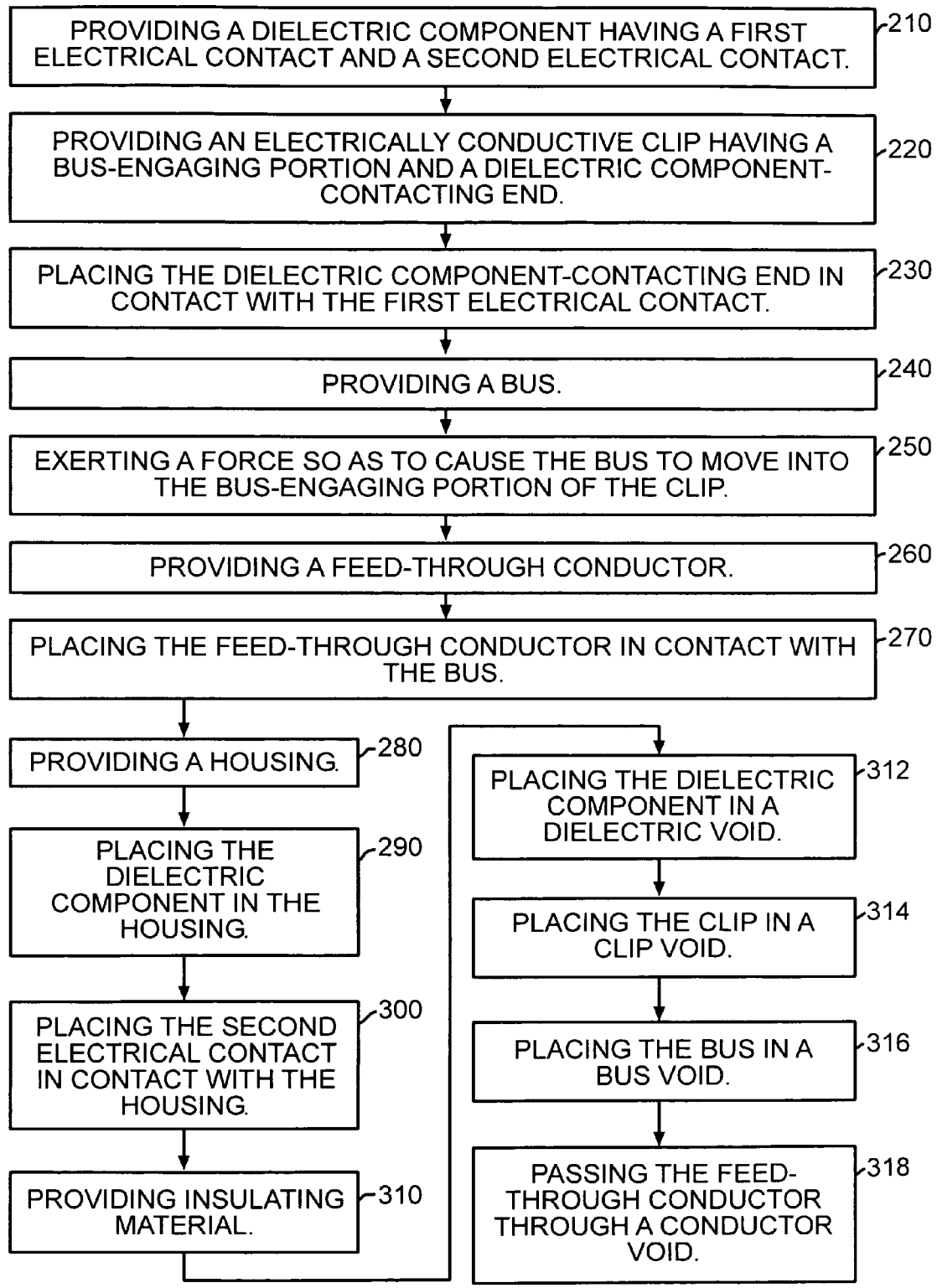
FIG. 16 is a flow chart of the method of FIG. 15 showing additional steps.

FIG. 16 shows method 200 augmented with additional steps. The method 200 of assembling may also comprise the step of providing 280 a housing and placing 290 the dielectric component within the housing. The second electrical contact of the dielectric component may be placed 300 in contact with the housing. The method 200 may include providing 310 insulating material, which may include voids for the dielectric component, the clip, and the conductor. Examples of such voids are shown in FIG. 9 as a dielectric void 92, a clip void 94, a conductor void 96, and a bus void 98. The dielectric component may be placed 312 in the dielectric void, the clip may be placed 314 in the clip void, the bus may be placed 316 in the bus void, and the feed-through conductor may be passed through 318 the conductor void.

U.S. provisional patent application No. 60/968,791, filed on Aug. 29, 2007, discloses additional details about the invention and additional embodiments of the invention. The disclosure of that patent application is incorporated by this reference.

Although the present invention has been described with respect to one or more particular embodiments, it will be understood that other embodiments of the present invention may be made without departing from the spirit and scope of the present invention. Hence, the present invention is deemed limited only by the appended claims and the reasonable interpretation thereof.

What is claimed is:

1. An electromagnetic filter, comprising:
    a feed-through conductor having an integral extension extending away from a longitudinal dimension of the feed-through conductor;
    an electrically conductive clip having an extension-engaging portion and a dielectric component-contacting end, wherein the extension-engaging portion contacts the extension; and
    a dielectric component having a first electrical contact and a second electrical contact,
    wherein the first electrical contact is electrically connected to the dielectric component-contacting end of the clip; and
    wherein the extension-engaging portion of the clip comprises:
        a base having two ends;
        two arms, each arm having a base end and a far end, wherein each arm's base end is connected to a different one of the two ends of the base; and
        wherein a distance between the arms is less than a width of the extension, the width being measured perpendicular to the longitudinal dimension.

2. The electromagnetic filter of claim 1, wherein the extension-engaging portion contacts the extension at least two locations on the extension.

3. The electromagnetic filter of claim 1, further comprising an additional dielectric component having a first electrical contact and a second electrical contact, and wherein the clip further comprises a second dielectric component-contacting end electrically connected to the first electrical contact of the additional dielectric component.

4. The electromagnetic filter of claim 1, wherein the extension resides between the two arms.

5. The electromagnetic filter of claim 4, wherein the far end of at least one of the two arms is the dielectric component-contacting end of the clip, and the dielectric component-contacting end is configured to create a spring force on the first electrical contact of the dielectric component.

6. The electromagnetic filter of claim 5, wherein the dielectric component-contacting end is curved.

7. The electromagnetic filter of claim 1, wherein the dielectric component is proximate to the feed-through conductor and a primary dimension of the dielectric component is oriented substantially parallel to the longitudinal dimension of the feed-through conductor.

8. The electromagnetic filter of claim 1, wherein a cross-section of the extension has a shape that differs from a cross-sectional shape of the feed-through conductor, when the cross-sections are taken along a plane perpendicular to the longitudinal dimension of the feed-through conductor.

9. The electromagnetic filter of claim 1, wherein the dielectric component includes at least two dielectric devices electrically connected in series to each other.

10. The electromagnetic filter of claim 1, further comprising a housing surrounding the dielectric component.

11. The electromagnetic filter of claim 10, wherein the second electrical contact of the dielectric component is electrically connected to the housing.

12. The electromagnetic filter of claim 10, further comprising insulating material disposed around the dielectric component.

13. The electromagnetic filter of claim 1, further comprising a substrate having a first side, a second side, and a feed-through surface, the feed-through surface defining an orifice extending from the first side to the second side, and wherein the feed-through conductor extends through the orifice.

14. The electromagnetic filter of claim 13, wherein the second electrical contact of the dielectric component is electrically connected to the substrate.

15. An electromagnetic filter, comprising:
a feed-through conductor having a longitudinal dimension;
a bus electrically connected to the feed-through conductor;
an electrically conductive clip having a bus-engaging portion and a dielectric component-contacting end, wherein the bus-engaging portion contacts the bus; and
a dielectric component having a first electrical contact and a second electrical contact, wherein the first electrical contact is electrically connected to the dielectric component-contacting end of the clip; and
wherein the bus-engaging portion of the clip comprises:
a base having two ends;
two arms, each arm having a base end and a far end, wherein each arm's base end is connected to a different one of the two ends of the base; and
wherein a distance between the arms is less than a thickness of the bus.

16. The electromagnetic filter of claim 15, further comprising a substrate having a first side, a second side, and a feed-through surface, the feed-through surface defining an orifice extending from the first side to the second side, and wherein the feed-through conductor extends through the orifice.

17. The electromagnetic filter of claim , wherein the second electrical contact of the dielectric component is electrically connected to the substrate.

18. The electromagnetic filter of claim 15, wherein the bus further comprises an integral tab contacting the feed-through conductor.

19. The electromagnetic filter of claim 15, wherein the bus-engaging portion contacts the bus at least two locations on the bus.

20. The electromagnetic filter of claim 15, wherein the bus resides between the two arms.

21. The electromagnetic filter of claim 20, wherein the far end of at least one of the two arms is the dielectric component-contacting end of the clip, and the dielectric component-contacting end is configured to create a spring force on the first electrical contact of the dielectric component.

22. The electromagnetic filter of claim 21, wherein the dielectric component-contacting end is curved.

23. The electromagnetic filter of claim 15, wherein the dielectric component is proximate to the feed-through conductor and a primary dimension of the dielectric component is oriented substantially parallel to the longitudinal dimension of the feed-through conductor.

24. The electromagnetic filter of claim 15, wherein the dielectric component includes at least two dielectric devices electrically connected in series to each other.

25. The electromagnetic filter of claim 15, further comprising a housing surrounding the dielectric component.

26. The electromagnetic filter of claim 25, wherein the second end of the dielectric component is electrically connected to the housing.

27. The electromagnetic filter of claim 25, further comprising insulating material disposed around the dielectric component.

28. The electromagnetic filter of claim 15, further comprising an additional dielectric component having a first electrical contact and a second electrical contact, and wherein the clip further comprises a second dielectric component-contacting end electrically connected to the first electrical contact of the additional dielectric component.

29. A method of assembling an electromagnetic filter, comprising the steps of:
providing a dielectric component having a first electrical contact and a second electrical contact;
providing an electrically conductive clip having an extension-engaging portion and a dielectric component-contacting end; and
wherein the extension-engaging portion of the clip comprises:
a base having two ends;
two arms, each arm having a base end and a far end, wherein each arm's base end is connected to a different one of the two ends of the base; and
wherein a distance between the arms is less than a width of the extension, the width being measured perpendicular to the longitudinal dimension;
placing the dielectric component-contacting end in contact with the first electrical contact in order to form an electrical connection between the dielectric component and the clip;
providing a feed-through conductor having an integral extension extending away from a longitudinal dimension of the feed-through conductor; and
exerting a force so as to cause the extension to move into the extension-engaging portion of the clip in order to form an electrical connection between the extension and the clip.

30. The method of claim 29 wherein the extension is pressed into the extension-engaging portion of the clip.

31. The method of claim 29 further comprising the steps of:
providing a housing; and
placing the dielectric component within the housing.

32. The method of claim 31 further comprising the step of placing the second electrical contact in contact with the housing to make an electrical connection.

33. The method of claim 31 further comprising the steps of:

providing insulating material in the housing, the insulating material having a dielectric component void, a clip void, and a conductor void;
placing the dielectric component into the dielectric component void;
placing the clip into the clip void; and
passing the feed-through conductor through the conductor void.

34. A method of assembling an electromagnetic filter, comprising the steps of:
providing a dielectric component having a first electrical contact and a second electrical contact;
providing an electrically conductive clip having a bus-engaging portion and a dielectric component-contacting end, wherein the bus-engaging portion of the clip comprises:
  a base having two ends;
  two arms, each arm having a base end and a far end, wherein each arm's base end is connected to a different one of the two ends of the base; and
  wherein a distance between the arms is less than a thickness of the bus;
placing the dielectric component-contacting end in contact with the first electrical contact in order to form an electrical connection between the dielectric component and the clip;
providing a bus;
exerting a force so as to cause the bus to move into the bus-engaging portion of the clip in order to form an electrical connection between the bus and the clip;
providing a feed-through conductor; and
placing the feed-through conductor in contact with the bus.

35. The method of claim 34 wherein the bus is pressed into the bus-engaging portion of the clip.

36. The method of claim 34 further comprising the steps of:
providing a housing; and
placing the dielectric component within the housing.

37. The method of claim 36 further comprising the step of placing the second electrical contact in contact with the housing to make an electrical connection.

38. The method of claim 36 further comprising the steps of:
providing insulating material in the housing, the insulating material having a dielectric component void, a clip void, a bus void, and a conductor void;
placing the dielectric component into the dielectric component void;
placing the clip into the clip void;
placing the bus into the bus void; and
passing the feed-through conductor through the conductor void.

* * * * *

UNITED STATES PATENT AND TRADEMARK OFFICE
CERTIFICATE OF CORRECTION

PATENT NO. : 8,289,105 B2
APPLICATION NO. : 12/202215
DATED : October 16, 2012
INVENTOR(S) : Chereson et al.

Page 1 of 1

It is certified that error appears in the above-identified patent and that said Letters Patent is hereby corrected as shown below:

In the claims:

Column 8, line 55, in claim 2, "at least two" should read:

--at at least two--;

Column 9, line 57, in claim 17, "The electromagnetic filter of claim ," should read:

--The electromagnetic filter of claim 16,--; and

Column 9, line 64, in claim 19, "at least two" should read:

--at at least two--.

Signed and Sealed this
Eighteenth Day of December, 2012

David J. Kappos
*Director of the United States Patent and Trademark Office*